(12) United States Patent
Matsumoto et al.

(10) Patent No.: US 7,692,916 B2
(45) Date of Patent: Apr. 6, 2010

(54) CAPACITIVE COUPLING PLASMA PROCESSING APPARATUS AND METHOD

(75) Inventors: Naoki Matsumoto, Nirasaki (JP); Hideaki Tanaka, Nirasaki (JP); Hisashi Fujiwara, Nirasaki (JP); Chishio Koshimizu, Nirasaki (JP); Fumiaki Koiwa, Miyagi-gun (JP); Toshiyuki Kobayashi, Miyagi-gun (JP); Youichi Nakayama, Nirasaki (JP); Hiroshi Nakamura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 514 days.

(21) Appl. No.: 11/393,916

(22) Filed: Mar. 31, 2006

(65) Prior Publication Data

US 2007/0029194 A1 Feb. 8, 2007

Related U.S. Application Data

(60) Provisional application No. 60/666,696, filed on Mar. 31, 2005.

(30) Foreign Application Priority Data

Mar. 31, 2005 (JP) ............................. 2005-102952

(51) Int. Cl.
  *H01L 21/683* (2006.01)
(52) U.S. Cl. ...................................... 361/234
(58) Field of Classification Search ................. 361/234
  See application file for complete search history.

(56) References Cited

U.S. PATENT DOCUMENTS

| 4,333,814 | A | | 6/1982 | Küyel |
| 5,660,694 | A | * | 8/1997 | Ohmi et al. ............ 204/192.12 |
| 5,716,534 | A | * | 2/1998 | Tsuchiya et al. .............. 216/67 |
| 6,576,860 | B2 | * | 6/2003 | Koshimizu et al. ..... 219/121.43 |
| 2004/0192056 | A1 | | 9/2004 | Iijima et al. |
| 2006/0037701 | A1 | | 2/2006 | Koshiishi et al. |
| 2006/0037703 | A1 | | 2/2006 | Koshiishi et al. |
| 2006/0066247 | A1 | | 3/2006 | Koshiishi et al. |

FOREIGN PATENT DOCUMENTS

| EP | 1 193 746 A1 | 4/2002 |
| JP | 2000-323460 | 11/2000 |

\* cited by examiner

*Primary Examiner*—Stephen W Jackson
*Assistant Examiner*—Scott Bauer
(74) *Attorney, Agent, or Firm*—Oblon, Spivak, McClelland, Maier & Neustadt, L.L.P.

(57) ABSTRACT

A plasma processing apparatus includes a process container configured to accommodate a target substrate and to be vacuum-exhausted. A first electrode and a second electrode are disposed opposite each other within the process container. A process gas supply unit is configured to supply a process gas into the process container. An RF power supply is configured to apply an RF power to the first electrode or second electrode to generate plasma of the process gas. A DC power supply is configured to apply a DC voltage to the first electrode or second electrode. A control section is configured to control the RF power supply and the DC power supply such that the DC power supply causes the DC voltage applied therefrom to reach a voltage set value, when or after the RF power supply starts applying the RF power.

27 Claims, 9 Drawing Sheets

F I G. 15

CAPACITIVE COUPLING PLASMA PROCESSING APPARATUS AND METHOD

CROSS-REFERENCE TO RELATED APPLICATIONS

This application claims the benefit of U.S. Provisional Application No. 60/666,696, filed Mar. 31, 2005.

This application is based upon and claims the benefit of priority from prior Japanese Patent Application No. 2005-102952, filed Mar. 31, 2005, the entire contents of which are incorporated herein by reference.

BACKGROUND OF THE INVENTION

1. Field of the Invention

The present invention relates to a plasma processing apparatus and method of the capacitive coupling type, used for performing a plasma process on a target substrate in, e.g., a semiconductor processing system. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

In the process of manufacturing semiconductor devices, plasma etching processes are often used to form circuits on a semiconductor wafer treated as a target substrate. There are various plasma etching apparatuses for performing such plasma etching, but parallel-plate plasma processing apparatuses of the capacitive coupling type are presently in the mainstream.

In general, a parallel-plate plasma etching apparatus of the capacitive coupling type includes a chamber with parallel-plate electrodes (upper and lower electrodes) disposed therein. While a process gas is supplied into the chamber, an RF (radio frequency) is applied to one of the electrodes to form an RF electric field between the electrodes. The process gas is ionized into plasma by the RF electric field, thereby performing a plasma etching process on a semiconductor wafer.

In recent years, design rules for ULSIs have been increasingly miniaturized, and the shape of holes is required to have a higher aspect ratio. For this reason, there is a proposal to use an application RF power with a higher frequency, so as to generate high density plasma while maintaining a good dissociation state of the plasma. This method makes it possible to suitably generate plasma under a lower pressure, which can meet miniaturization of design rules.

However, even where such an RF power with a higher frequency is used, plasma uniformity is still unsatisfactory. In order to solve this problem, Jpn. Pat. Appln. KOKAI Publication No. 2000-323460 (Patent Document 1) discloses a plasma processing technique. According to this technique, an upper electrode is supplied with a DC (direct current) voltage, as well as an RF power with a frequency of 27 MHz or more, to control plasma so as to uniformize the plasma density.

Where a DC voltage is applied as in the technique disclosed in Patent Document 1, the application timing of the DC voltage should be influential on plasma generation. However, Patent Document 1 is silent about the application timing of the DC voltage to generate stable and good plasma.

BRIEF SUMMARY OF THE INVENTION

An object of the present invention is to generate good plasma in a plasma processing apparatus and method of the capacitive coupling type in which a DC voltage is applied in addition to an RF power.

According to a first aspect of the present invention, there is provided a plasma processing apparatus comprising:

a process container configured to accommodate a target substrate and to be vacuum-exhausted;

a first electrode and a second electrode disposed opposite each other within the process container;

a process gas supply unit configured to supply a process gas into the process container;

an RF power supply configured to apply an RF power to the first electrode or second electrode to generate plasma of the process gas;

a DC power supply configured to apply a DC voltage to the first electrode or second electrode; and a control section configured to control the RF power supply and the DC power supply, wherein the control section performs control such that the DC power supply causes the DC voltage applied therefrom to reach a voltage set value, when or after the RF power supply starts applying the RF power.

According to a second aspect of the present invention, there is provided a plasma processing apparatus comprising:

a process container configured to accommodate a target substrate and to be vacuum-exhausted;

a first electrode disposed within the process container and configured to serve as an upper electrode;

a second electrode disposed opposite the first electrode within the process container and configured to serve as a lower electrode to place the target substrate thereon;

a process gas supply unit configured to supply a process gas into the process container;

a first RF power supply configured to apply a first RF power to the first electrode to generate plasma of the process gas;

a second RF power supply configured to apply a second RF power to the second electrode to attract ions toward the target substrate;

a DC power supply configured to apply a DC voltage to the first electrode; and a control section configured to control the first and second RF power supplies and the DC power supply, wherein the control section performs control such that the DC power supply causes the DC voltage applied therefrom to reach a voltage set value, when or after the first RF power supply starts applying the first RF power.

According to a third aspect of the present invention, there is provided a plasma processing method for performing a plasma process on a target substrate in a plasma processing apparatus, the plasma processing apparatus comprising a process container configured to accommodate a target substrate and to be vacuum-exhausted, a first electrode and a second electrode disposed opposite each other within the process container, a process gas supply unit configured to supply a process gas into the process container, an RF power supply configured to apply an RF power to the first electrode or second electrode to generate plasma of the process gas, and a DC power supply configured to apply a DC voltage to the first electrode or second electrode, and the plasma processing method comprising:

performing control such that the DC power supply causes the DC voltage applied therefrom to reach a voltage set value, when or after the RF power supply starts applying the RF power.

According to a fourth aspect of the present invention, there is provided a plasma processing method for performing a plasma process on a target substrate in a plasma processing apparatus, the plasma processing apparatus comprising a process container configured to accommodate a target substrate and to be vacuum-exhausted, a first electrode disposed within the process container and configured to serve as an upper electrode, a second electrode disposed opposite the first electrode within the process container and configured to serve as a lower electrode to place the target substrate thereon, a process gas supply unit configured to supply a process gas into the process container, a first RF power supply configured to apply a first RF power to the first electrode to generate plasma of the process gas, a second RF power supply configured to apply a second RF power to the second electrode to attract ions toward the target substrate, and a DC power supply configured to apply a DC voltage to the first electrode, the plasma processing method comprising:

performing control such that the DC power supply causes the DC voltage applied therefrom to reach a voltage set value, when or after the first RF power supply starts applying the first RF power.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Embodiments of the present invention will now be described with reference to the accompanying drawings. In the following description, the constituent elements having substantially the same function and arrangement are denoted by the same reference numerals, and a repetitive description will be made only when necessary.

Figure 1:
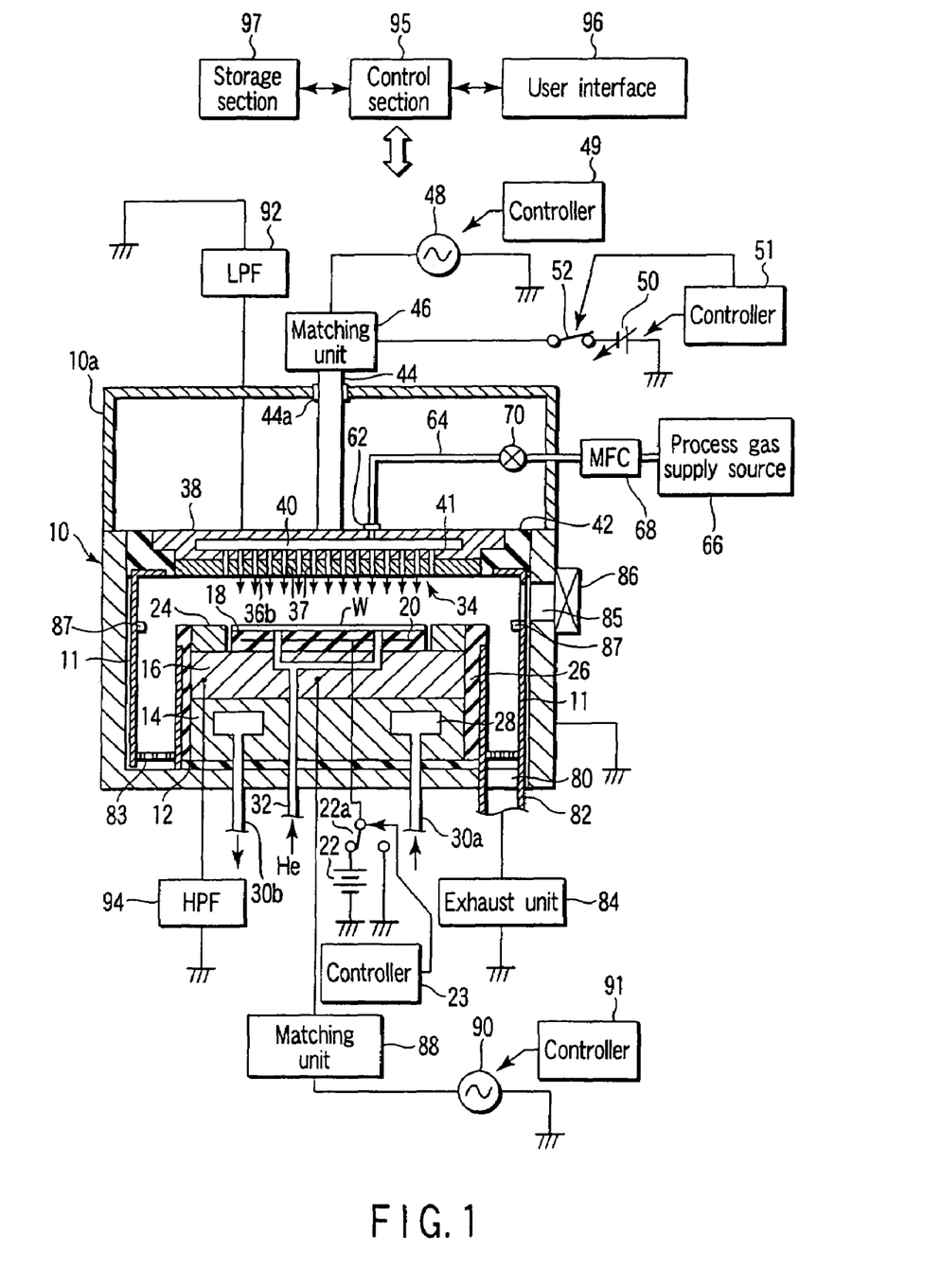
FIG. 1 is a sectional view schematically showing a plasma etching apparatus according to an embodiment of the present invention.

FIG. 1 is a sectional view schematically showing a plasma etching apparatus according to an embodiment of the present invention. This plasma etching apparatus is structured as a parallel-plate plasma etching apparatus of the capacitive coupling type. The apparatus includes a cylindrical chamber (process container) 10, which is made of, e.g., aluminum with an anodization-processed surface. The chamber 10 is protectively grounded.

A columnar susceptor pedestal 14 is disposed on the bottom of the chamber 10 through an insulating plate 12 made of, e.g., a ceramic. A susceptor 16 made of, e.g., aluminum is disposed on the susceptor pedestal 14. The susceptor 16 is used as a lower electrode, on which a target substrate, such as a semiconductor wafer W, is placed.

The susceptor 16 is provided with an electrostatic chuck 18 on the top, for holding the target substrate or semiconductor wafer W by an electrostatic attraction force. The electrostatic chuck 18 comprises an electrode 20 made of a conductive film, and a pair of insulating layers or insulating sheets sandwiching the electrode 20. The electrode 20 is electrically connected to a DC (direct current) power supply 22, and the connection thereof is turned on and off by an ON/OFF switch 22a. The semiconductor wafer W is attracted and held on the electrostatic chuck 18 by an electrostatic attraction force, e.g., a Coulomb force, generated by a DC voltage applied from the DC power supply 22. The ON/OFF operation of the ON/OFF switch 22a is controlled by a controller 23.

A conductive focus ring (correction ring) 24 made of, e.g., silicon is disposed on the top of the susceptor 16 to surround the electrostatic chuck 18 (and the semiconductor wafer W) to improve etching uniformity. A cylindrical inner wall member 26 made of, e.g., quartz is attached to the side of the susceptor 16 and susceptor pedestal 14.

The susceptor pedestal 14 is provided with a cooling medium space 28 formed therein. A cooling medium set at a predetermined temperature, such as cooling water, is circulated within the cooling medium space 28 from an external chiller unit (not shown) through lines 30a and 30b. The temperature of the cooling medium is set to control the process temperature of the semiconductor wafer W placed on the susceptor 16. Further, a heat transmission gas, such as He gas, is supplied from a heat transmission gas supply unit (not shown), through a gas supply line 32, into the interstice between the top surface of the electrostatic chuck 18 and the bottom surface of the semiconductor wafer W.

An upper electrode 34 is disposed above the lower electrode or susceptor 16 in parallel with the susceptor. The space between the electrodes 16 and 34 is used as a plasma generation space. The upper electrode 34 defines a surface facing the semiconductor wafer W placed on the lower electrode or susceptor 16, and thus this facing surface is in contact with the plasma generation space.

The upper electrode 34 is supported at the top of the chamber 10 by an insulating shield member 42. The upper electrode 34 includes an electrode plate 36 defining the facing surface opposite the susceptor 16 and having a number of gas delivery holes 37, and an electrode support 38 detachably supporting the electrode plate 36. The electrode support 38 is made of a conductive material, such as aluminum with an anodization-processed surface, and has a water-cooled structure. The electrode plate 36 is preferably made of a conductor or semiconductor having a low resistivity and thus generating less Joule heat. Further, in order to reinforce a resist film, as described later, the electrode plate 36 is preferably made of a silicon-containing substance. In light of these factors, the electrode plate 36 is preferably made of silicon or SiC. The electrode support 38 has a gas diffusion cell 40 formed therein, which is connected to the gas delivery holes 37 through a number of gas flow channels 41 extending downward.

Further, the electrode support 38 has a gas feed port 62 formed therein for feeding a process gas into the gas diffusion cell 40. The gas feed port 62 is connected to a process gas supply source 66 through a gas supply line 64. The gas supply line 64 is provided with a mass-flow controller (MFC) 68 and a switching valve 70 disposed thereon in this order from the upstream. A process gas for etching, such as a fluorocarbon gas ($C_xF_y$), e.g., $C_4F_8$ gas, is supplied from the process gas supply source 66 through the gas supply line 64 into the gas diffusion cell 40. Then, the process gas flows through the gas flow channels 41 and is delivered from the gas delivery holes 37 into the plasma generation space, as in a shower device. In other words, the upper electrode 34 serves as a showerhead for supplying a process gas.

The upper electrode 34 is electrically connected to a first RF power supply 48 through a matching unit 46 and a feed rod 44. The first RF power supply 48 outputs an RF power with a frequency of 13.56 MHz or more, such as 60 MHz. The matching unit 46 is arranged to match the load impedance with the internal (or output) impedance of the first RF power supply 48. When plasma is generated within the chamber 10, the matching unit 46 performs control for the output impedance of the first RF power supply 48 to apparently agree with the load impedance. The output terminal of the matching unit 46 is connected to the top of the feed rod 44. The ON/OFF operation and power of the first RF power supply 48 are controlled by a controller 49.

Further, the upper electrode 34 is electrically connected to a variable DC power supply 50 in addition to the first RF power supply 48. The variable DC power supply 50 is preferably formed of a bipolar power supply. Specifically, the variable DC power supply 50 is connected to the upper electrode 34 through the matching unit 46 and feed rod 44, and the connection thereof is turned on and off by a relay circuit (ON/OFF switch) 52. The polarity, current, and voltage of the variable DC power supply 50 and the ON/OFF operation of the relay circuit 52 are controlled by a controller 51.

Figure 2:
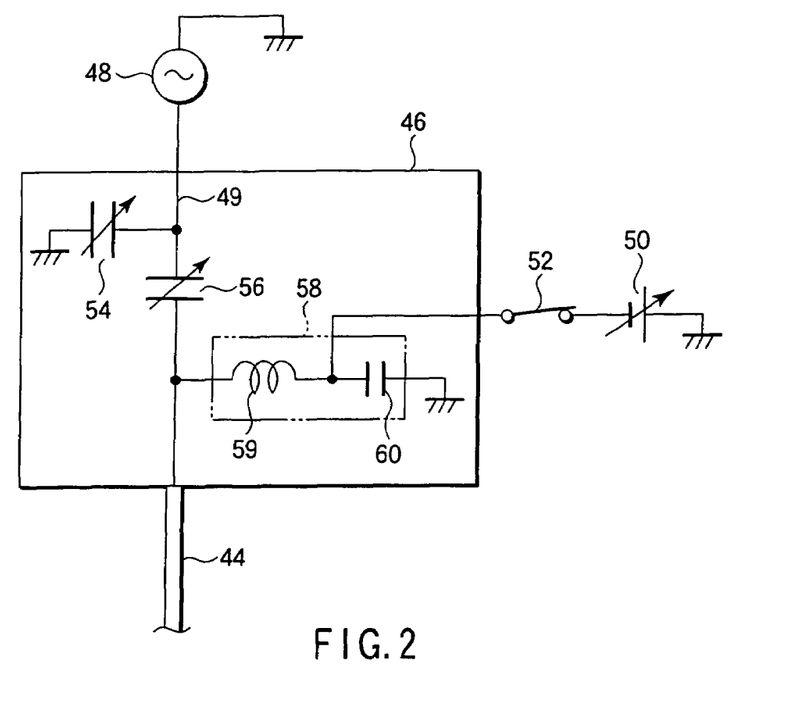
FIG. 2 is a view showing a matching unit connected to a first RF (radio frequency) power supply in the plasma etching apparatus shown in FIG. 1.

FIG. 2 is a view showing the matching unit 46 connected to the first RF power supply 48 in the plasma etching apparatus shown in FIG. 1. As shown in FIG. 2, the matching unit 46 includes a first variable capacitor 54 branched from a feed line 49 of the first RF power supply 48, and a second variable capacitor 56 disposed on the feed line 49 downstream from the branch point, so as to exercise the function described above. The matching unit 46 also includes a filter 58 configured to trap the RF power (for example, 60 MHz) from the first RF power supply 48 and the RF power (for example, 2 MHz) from a second RF power supply described later, so that a DC voltage current (which will be simply referred to as a DC voltage) is effectively supplied to the upper electrode 34. As a consequence, a DC current is connected from the variable DC power supply 50 through the filter 58 to the feed line 49. The filter 58 is formed of a coil 59 and a capacitor 60 arranged to trap the RF power from the first RF power supply 48 and the RF power from the second RF power supply described later.

The sidewall of the chamber 10 extends upward above the height level of the upper electrode 34 and forms a cylindrical grounded conductive body 10a. The top wall of the cylindrical grounded conductive body 10a is electrically insulated from the upper feed rod 44 by a tube-like insulating member 44a.

The susceptor 16 used as a lower electrode is electrically connected to a second RF power supply 90 through a matching unit 88. The RF power supplied from the second RF power supply 90 to the lower electrode or susceptor 16 is used for attracting ions toward the semiconductor wafer W. The second RF power supply 90 outputs an RF power with a frequency of 2 to 27 MHz, such as 2 MHz. The matching unit 88 is arranged to match the load impedance with the internal (or output) impedance of the second RF power supply 90. When plasma is generated within the chamber 10, the matching unit 88 performs control for the internal impedance of the second RF power supply 90 to apparently agree with the load impedance. The ON/OFF operation and power of the second RF power supply 90 are controlled by a controller 91.

The upper electrode 34 is electrically connected to a low-pass filter (LPF) 92, which prevents the RF (60 MHz) from the first RF power supply 48 from passing through, while it allows the RF (2 MHz) from the second RF power supply 98 to pass through to ground. The low-pass filter (LPF) 92 is preferably formed of an LR filter or LC filter. However, a single conducting wire can apply a sufficiently large reactance to the RF power (60 MHz) from the first RF power supply 48, and thus such a wire may be used in place of the LPF 92. On the other hand, the lower electrode or susceptor 16 is electrically connected to a high-pass filter (HPF) 94, which allows the RF (60 MHz) from the first RF power supply 48 to pass through to ground.

An exhaust port 80 is formed at the bottom of the chamber 10, and is connected to an exhaust unit 84 through an exhaust line 82. The exhaust unit 84 includes a vacuum pump, such as a turbo molecular pump, to reduce the pressure inside the chamber 10 to a predetermined vacuum level. A transfer port 85 for a semiconductor wafer W is formed in the sidewall of the chamber 10, and is opened/closed by a gate valve 86 attached thereon. A deposition shield 11 is detachably disposed along the inner wall of the chamber 10 to prevent etching by-products (deposition) from being deposited on the wall. In other words, the deposition shield 11 constitutes a chamber wall. A deposition shield 11 is also disposed around the inner wall member 26. An exhaust plate 83 is disposed at the bottom of the chamber 10 between the deposition shield 11 on the chamber wall and the deposition shield 11 on the inner wall member 26. The deposition shield 11 and exhaust plate 83 are preferably made of an aluminum body covered with a ceramic, such as $Y_2O_3$.

A conductive member (GND block) 87 is disposed on a portion of the deposition shield 11 that constitutes the chamber inner wall, at a height essentially the same as the wafer W, and is connected to ground in the sense of DC. The GND block 87 is exposed to plasma, and is electrically connected to a conductive portion in the deposition shield 11. The DC voltage current applied from the variable DC power supply 50 to the upper electrode 34 flows through the process space to the GND block 87, and is then grounded through the deposition shield 11. The GND block 87 allows electrons accumulated in the upper electrode 34 to be released, thereby preventing abnormal electric discharge. The GND block 87 is made of a conductor, and preferably a silicon-containing substance, such as Si or SiC. The GND block 87 may be preferably made of C.

The position of the GND block 87 is not limited to that shown in FIG. 1, as long as it is disposed in the plasma generation area. For example, the GND block 87 may be disposed on the susceptor 16 side, e.g., around the susceptor 16. Alternatively, the GND block 87 may be disposed near the upper electrode 34, e.g., as a ring disposed outside the upper electrode 34.

Respective portions of the plasma etching apparatus are connected to and controlled by a control section (process controller) 95. In this embodiment, the ON/OFF operation and power of the first RF power supply 48 are controlled by a controller 49. The ON/OFF operation and power of the second RF power supply 90 are controlled by a controller 91. The polarity, current, and voltage of the variable DC power supply 50 and the ON/OFF operation of the relay circuit 52 are controlled by a controller 51. The ON/OFF operation of the ON/OFF switch 22a for switching the DC power supply 22 is controlled by a controller 23. These controllers 49, 91, 51, and 23 are operated by the control section 95 to control the timing of performing and stopping applications of the powers and voltage described above.

The control section 95 is connected to a user interface 96 including, e.g., a keyboard and a display, wherein the keyboard is used for a process operator to input commands for operating the plasma etching apparatus, and the display is used for showing visualized images of the operational status of the plasma processing apparatus.

Further, the control section 95 is connected to a storage section 97 that stores control programs for the control section 95 to control the plasma etching apparatus so as to perform various processes, and programs or recipes for respective components of the plasma etching apparatus to perform processes in accordance with process conditions. Recipes may be stored in a hard disk or semiconductor memory, or stored in a computer readable portable storage medium, such as a CDROM or DVD, to be attached to a predetermined position in the storage section 97.

A required recipe is retrieved from the storage section 97 and executed by the control section 95 in accordance with an instruction or the like through the user interface 96. As a consequence, the plasma etching apparatus can perform a predetermined process under the control of the control section 95.

When an etching process is performed in the plasma etching apparatus described above, the gate valve 86 is first opened, and a semiconductor wafer W to be etched is transferred into the chamber 10 and placed on the susceptor 16. Then, a process gas for etching is supplied from the process gas supply source 66 into the gas diffusion cell 40 at a predetermined flow rate, and then supplied into the chamber 10 through the gas flow channels 41 and gas delivery holes 37. At the same time, the interior of the chamber 10 is exhausted by the exhaust unit 84 to set the pressure inside the chamber 10 to be a predetermined value within a range of, e.g., 0.1 to 150 Pa. The process gas may be selected from various gases conventionally employed, and preferably is a gas containing a halogen element, a representative of which is a fluorocarbon gas ($C_xF_y$), such as $C_4F_8$ gas. Further, the process gas may contain another gas, such as Ar gas or $O_2$ gas.

While the etching gas is supplied into the chamber 10, an RF power for plasma generation is applied from the first RF power supply 48 to the upper electrode 34 at a predetermined power level. At the same time, an RF power for ion attraction is applied from the second RF power supply 90 to the lower electrode or susceptor 16 at a predetermined power level. Further, a predetermined DC voltage is applied from the variable DC power supply 50 to upper electrode 34.

At this time, the controllers 49, 51, and 91 are operated by the control section 95 to control the timing of performing applications of the powers and voltage described above. Specifically, control is performed such that the variable DC power supply 50 causes the DC voltage applied therefrom to reach a voltage set value prescribed in a recipe, when or after the first RF power supply 48 starts applying the RF power. Set values used hereinafter denote the values of the DC voltage or RF powers used to perform the etching process.

This control is adopted to prevent abnormal electric discharge from occurring, which can be achieved by causing the application DC voltage not to reach the voltage set value until the first RF power supply 48 starts applying the RF power for the first time to thereby ignite the plasma. If the DC voltage applied reaches its set value while no plasma is present within the chamber 10, abnormal electric discharge can easily occur, even though this results in little damage to the wafer W. Preferably, the variable DC power supply 50 starts applying the DC voltage after the first RF power supply 48 starts applying the RF power. Where the DC voltage starts being applied after the first RF power supply 48 starts applying the RF power to thereby ignite the plasma, it is possible not only to prevent abnormal electric discharge, but also to perform the voltage application smoothly. Further, preferably, the DC voltage starts being applied after the RF power applied from the first RF power supply 48 reaches its set value. This makes it possible to more reliably prevent abnormal electric discharge from occurring.

Figure 3:
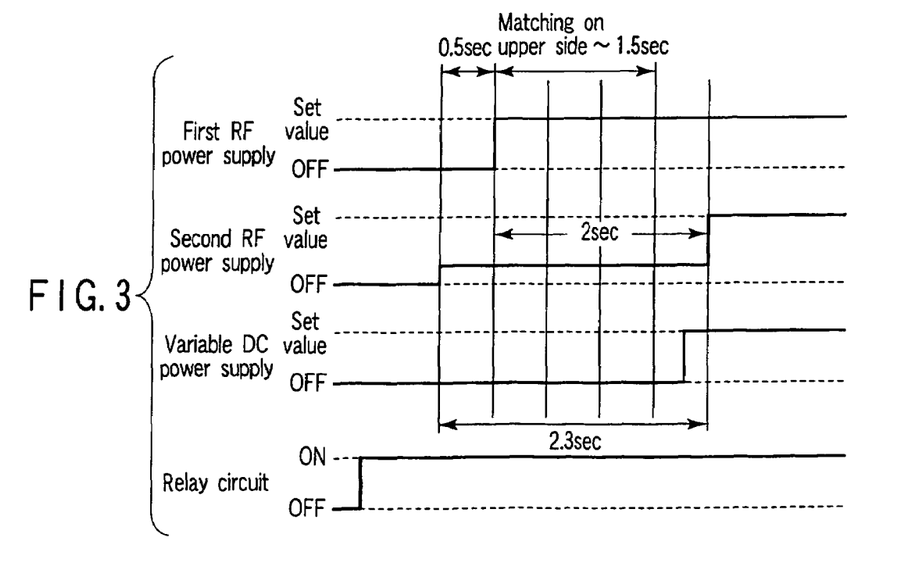
FIG. 3 is a view showing a preferable example of an application sequence, which involves the DC (direct current) voltage of a variable DC power supply and the RF powers of first and second RF power supplies, along with the ON/OFF of a relay circuit, used in the plasma etching apparatus shown in FIG. 1.

Next, with reference to FIG. 3, an explanation will be given of a preferable example of an application sequence involving the RF power of the second RF power supply 90, as well as the DC voltage of the variable DC power supply 50 and the RF power of the first RF power supply 48. FIG. 3 is a view showing a preferable example of an application sequence, which involves the DC voltage of the variable DC power supply 50 and the RF powers of first and second RF power supplies 48 and 90, along with the ON/OFF of the relay circuit 52, used in the plasma etching apparatus shown in FIG. 1.

At first, the second RF power supply 90 starts applying an RF power, such as 300 W, lower than its set value, to the lower electrode or susceptor 16. Then, when 0.1 to 2.4 seconds, such as 0.5 seconds, have elapsed, the first RF power supply 48 starts applying an RF power at its set value, such as 2,400 W, to the upper electrode 34. Then, for example, when 2.0 seconds have elapsed, the second RF power supply 90 shifts the application power to its set value, such as 3,800 W. Prior to this (for example, when 2.3 seconds have elapsed since the second RF power supply 90 started applying the RF power), the variable DC power supply 50 starts applying a DC voltage at its set value, such as −900V, to the upper electrode 34. If the DC voltage starts being applied after the second RF power supply 90 shifts the application power to its set value, the plasma may cause hunching. As described above, the second RF power supply 90 first applies an RF power lower than its set value, and then shifts the RF power to its set value (full power) after matching of the first RF power supply 48 is obtained (for example, when 1.5 seconds have elapsed since the first RF power supply started applying the RF power).

Further, before the DC voltage starts being applied and preferably before the first and second RF power supplies 48 and 90 start applying the RF powers, the relay circuit 52 is turned on to be ready for the DC voltage application. However, it is not preferable to always set the relay circuit 52 in an ON-state, and thus the relay circuit 52 should only be turned on, when needed.

Figure 4:
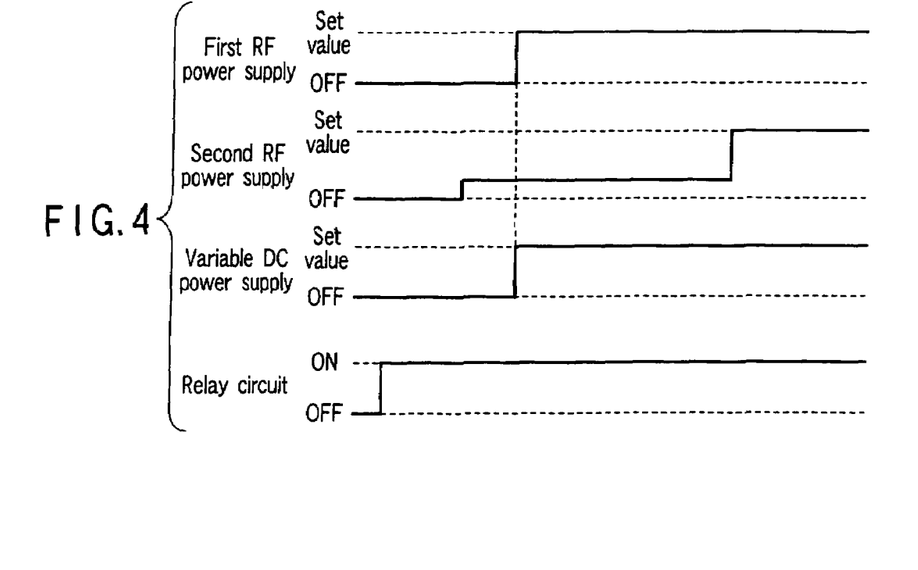
FIG. 4 is a view showing another preferable example of an application sequence, which involves the DC voltage of the variable DC power supply and the RF powers of the first and second RF power supplies, along with the ON/OFF of the relay circuit, used in the plasma etching apparatus shown in FIG. 1.

The timing at which the DC voltage reaches its set value may be made to coincide with the time point at which the first RF power supply 48 starts applying the RF power, instead of after the first RF power supply 48 starts applying the RF power. FIG. 4 is a view showing another preferable example of an application sequence, which involves the DC voltage of the variable DC power supply 50 and the RF powers of first and second RF power supplies 48 and 90, along with the ON/OFF of the relay circuit 52, used in the plasma etching apparatus shown in FIG. 1.

At first, before the first and second RF power supplies 48 and 90 start applying RF powers, the relay circuit 52 is turned on to be ready for the DC voltage application. Then, as in the case shown in FIG. 3, the second RF power supply 90 starts applying an RF power lower than its set value to the susceptor 16. Then, the first RF power supply 48 starts applying an RF power at its set value to the upper electrode 34. At the same time the first RF power supply 48 starts applying the RF power, the variable DC power supply 50 starts applying a DC voltage at its set value to the upper electrode 34. Then, the second RF power supply 90 shifts the application power to its set value. With this arrangement, it is possible to prevent abnormal electric discharge from occurring, as in the case described above where the DC voltage reaches its set value after the first RF power supply 48 starts applying the RF power. In other words, the timing for the DC voltage to reach its set value may be placed at any time point, as long as it is not before the first RF power supply 48 starts applying the RF power.

Further, in accordance with an instruction from the control section 95, the controller 23 operates the ON/OFF switch 22a to turn on the DC power supply 22 at a predetermined timing. Consequently, a DC voltage is applied to the electrode 20 of the electrostatic chuck 18 to fix the semiconductor wafer W on the susceptor 16. The timing for the DC power supply 22 to apply the DC voltage is not limited to a specific one, and may be placed after the first RF power supply 48 starts applying the RF power and the variable DC power supply 50 starts applying the DC voltage.

The process gas delivered from the gas delivery holes 37 formed in the electrode plate 36 of the upper electrode 34 is ionized into plasma by glow discharge caused by the RF power applied across the upper electrode 34 and the lower electrode or susceptor 16. Radicals and ions generated in this plasma are used to etch the target surface of the semiconductor wafer W.

In this plasma etching apparatus, the upper electrode 34 is supplied with an RF power with a frequency selected from a high frequency range (such as 10 MHz or more, which ions cannot follow). In this case, since the density of plasma can be higher with a preferable dissociation state, high density plasma can be generated even under a low pressure.

When the plasma is generated, the variable DC power supply 50 applies a DC voltage with a predetermined polarity and value to the upper electrode 34 at the timing described above. Consequently, stable and good plasma is generated without increasing damage to the wafer W, so as to provide effects described later.

As shown in FIG. 1, the voltage applied from the variable DC power supply 50 to the upper electrode 34 is preferably set to be a negative voltage. A positive voltage may be used, but it makes the plasma unstable. Accordingly, where a positive voltage is applied, it is required to prepare some countermeasures, such as pulse-wise application.

Figure 5:
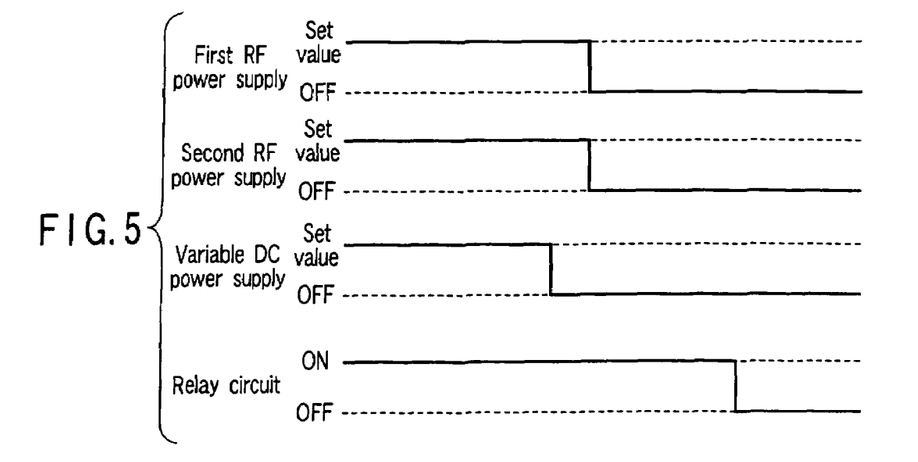
FIG. 5 is a view showing a preferable example of an application sequence, which involves the DC voltage of the variable DC power supply and the RF powers of the first and second RF power supplies, along with the ON/OFF of the relay circuit, used for ending plasma etching in the plasma etching apparatus shown in FIG. 1.
Figure 6:
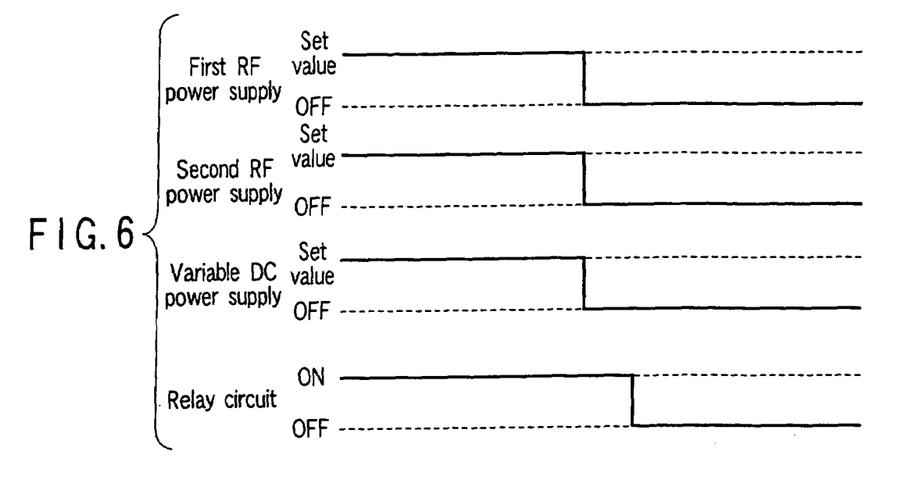
FIG. 6 is a view showing another preferable example of an application sequence, which involves the DC voltage of the variable DC power supply and the RF powers of the first and second RF power supplies, along with the ON/OFF of the relay circuit, used for ending plasma etching in the plasma etching apparatus shown in FIG. 1.

After the predetermined etching process is finished, the first and second RF power supplies 48 and 90 and the variable DC power supply 50 are turned off to extinguish plasma. Preferable examples of a sequence at this time will be explained with reference to FIGS. 5 and 6. FIGS. 5 and 6 are views showing two different preferable examples of an application sequence, which involves the DC voltage of the variable DC power supply 50 and the RF powers of first and second RF power supplies 48 and 90, along with the ON/OFF of the relay circuit 52, used for ending plasma etching in the plasma etching apparatus shown in FIG. 1.

The timing of extinguishing plasma is not limited to a specific one, but it is preferable to turn off the RF power application of the first and second RF power supplies 48 and 90 after turning off the DC voltage application of the variable DC power supply 50, as shown in FIG. 5. Further, it is more preferable to turn off the DC voltage application of the variable DC power supply 50, the RF power application of the first RF power supply 48, and the RF power application of the second RF power supply 90 at the same time, as shown in FIG. 6. In contrast, if turning off the DC voltage application of the variable DC power supply 50 comes after turning off the RF power application of the first and second RF power supplies 48 and 90, the following problem arises. Specifically, after turning off the RF power application, the interior of the chamber 10 comes into a vacuum state, which has a higher resistance, and thus an overshoot phenomenon may occur when a DC voltage current passes therethrough.

In order to protect the relay circuit 52, the relay circuit 52 is turned off after the variable DC power supply 50 stops applying the DC voltage and the first and second RF power supplies 48 and 90 stop applying the RF powers. Further, it is also important to select a plasma extinguish sequence that can prevent particle deposition on the wafer W, in accordance with process conditions. In order to prevent particle deposition, it is also effective to apply a reverse polarity voltage before turning off the DC voltage from the variable DC power supply 50.

In an experiment, the sequence shown in FIG. 3 was performed. A result of this experiment will be explained below.

The pressure inside a chamber was set at 3.3 Pa, and an etching gas of $C_4F_8/Ar/N_2$ was supplied at a flow rate of 6/1,000/180 mL/min into the chamber. Power application was performed in accordance with the sequence shown in FIG. 3, while the first RF power supply 48 output a power with a frequency of 60 MHz and a set value of 2,400 W, the second RF power supply 90 output a power with a set value of 3,800 W, and the variable DC power supply 50 output a voltage with a set value of −900V. Under these conditions, plasma was generated to perform etching on an oxide film on a wafer W.

Specifically, at first, the second RF power supply 90 started applying an RF power, such as 300 W, lower than its set value, to the lower electrode or susceptor 16. Then, when 0.5 seconds had elapsed since the start of the power application, the first RF power supply 48 started applying an RF power at the set value of 2,400 W to the upper electrode 34. Then, when 2.0 seconds had elapsed, the second RF power supply 90 shifted the application power to the set value of 3,800 W. Prior to this, when 2.3 seconds had elapsed since the second RF power supply 90 started applying the RF power, the variable DC power supply 50 started applying a DC voltage at the set value of −900V to the upper electrode 34. As a result, stable and good plasma was generated. From this result, it has been confirmed that the application timing of the DC voltage according to this embodiment can generate stable and good plasma without causing abnormal electric discharge.

Figure 7:
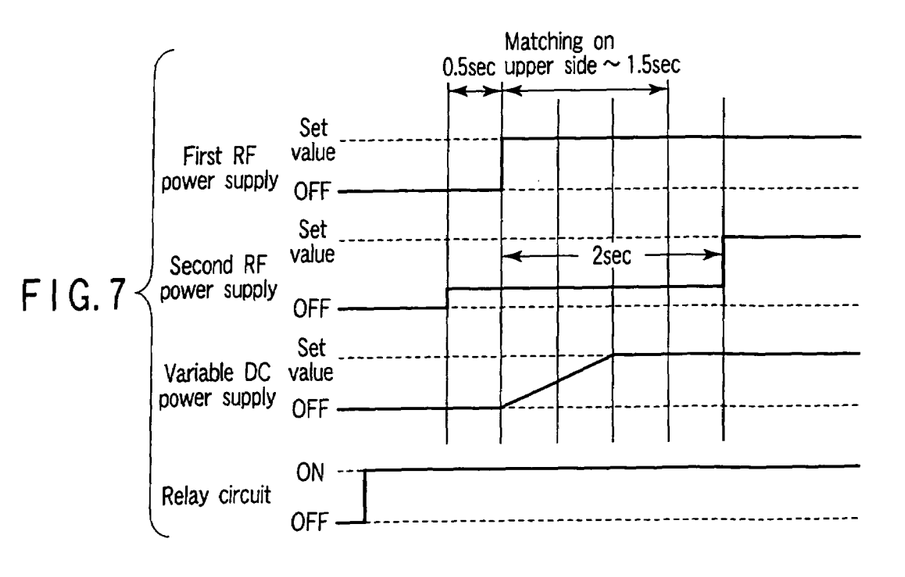
FIG. 7 is a view showing an alternative preferable example of an application sequence, which involves the DC voltage of the variable DC power supply and the RF powers of the first and second RF power supplies, along with the ON/OFF of the relay circuit, used in the plasma etching apparatus shown in FIG. 1.

Next, with reference to FIG. 7, an explanation will be given of another preferable example of an application sequence involving the DC voltage of the variable DC power supply 50 and the RF powers of the first and second RF power supplies 48 and 90. FIG. 7 is a view showing an alternative preferable example of an application sequence, which involves the DC voltage of the variable DC power supply 50 and the RF powers of first and second RF power supplies 48 and 90, along with the ON/OFF of the relay circuit 52, used in the plasma etching apparatus shown in FIG. 1.

At first, as in the case shown in FIG. 3, the second RF power supply 90 starts applying an RF power, such as 300 W, lower than its set value, to the lower electrode or susceptor 16. Then, when 0.1 to 2.4 seconds, such as 0.5 seconds, have elapsed, the first RF power supply 48 starts applying an RF power at its set value to the upper electrode 34. At the same time when the first RF power supply 48 starts applying the RF power or thereafter, the variable DC power supply 50 starts applying a DC voltage to the upper electrode 34 under control such that the application voltage is gradually increased to eventually reach its set value, such as −900V (i.e., gradual increase control). Then, for example, when 2.0 seconds have elapsed since the first RF power supply 48 started applying the RF power, the second RF power supply 90 shifts the application power to its set value. Where the DC voltage from the variable DC power supply 50 is gradually increased, as described above, the feed circuit of the variable DC power supply 50 can be less forced while damage to the wafer W is suppressed. The voltage boosting rate at this time is not limited to a specific one, and this rate can be suitably adjusted to be, e.g., around 1 kV/second, in accordance with a set voltage.

Further, before the DC voltage starts being applied and preferably before the first and second RF power supplies 48 and 90 start applying the RF powers, the relay circuit 52 is turned on to be ready for the DC voltage application.

In the example described above, the variable DC power supply 50 is controlled to gradually increase the application voltage. Alternatively, control may be performed such that the application current or application power is gradual increased to eventually reach its set voltage. Further, where any one of the application voltage, application current, and application power is gradually increased, an interlock function may be arranged. Specifically, where any one of these parameters is gradually increased, the controller 51 may be provided with a function to stop the power application when the absolute value or increased portion of the parameter exceeds its set value. With this arrangement, it is possible to more effectively prevent the variable DC power supply 50 and the feed circuit thereof from suffering an overload.

In an experiment, the voltage was gradually increased in accordance the sequence shown in FIG. 7. A result of this experiment will be explained below.

The pressure inside a chamber was set at 3.3 Pa, and an etching gas of $C_4F_8/Ar/O_2$ was supplied at a flow rate of 30/1,000/20 mL/min into the chamber. Power application was performed in accordance with the sequence shown in FIG. 7, while the first RF power supply 48 output a power with a frequency of 60 MHz and a set value of 1,800 W, the second RF power supply 90 output a power with a set value of 3,800 W, and the variable DC power supply 50 output a voltage with a set value of −900V. Under these conditions, plasma was generated to perform etching on an oxide film on a wafer W.

Specifically, at first, the second RF power supply 90 started applying an RF power, such as 300 W, lower than its set value, to the lower electrode or susceptor 16. Then, when 0.5 seconds had elapsed since the start of the power application, the first RF power supply 48 started applying an RF power at the set value of 1,800 W to the upper electrode 34. At the same time, the variable DC power supply 50 started applying a DC voltage to the upper electrode 34, such that the application voltage is gradually increased to the set value of −900V in about 8.0 seconds. Then, when 2.0 seconds had elapsed since the first RF power supply 48 started applying the RF power, the second RF power supply 90 shifted the application power to the set value of 3,800 W (experiment A). For comparison, when 2.3 seconds had elapsed since the second RF power supply 90 started applying the RF power, the variable DC power supply 50 started applying a DC voltage at the set value of −900V to the upper electrode 34 without gradual increase (experiment B). As a result, the ratio of devices on a wafer not damaged by plasma was almost 100% in both of the experiments A and B, i.e., the effect concerning wafer damage was not so different between the experiments A and B. Further, as regards the plasma state, stable and good plasma was generated in both of the experiments A and B. Accordingly, it has been confirmed that the gradual increase does not affect the process characteristics, but provide an advantage to reduce damage to the power supply.

Figure 8:
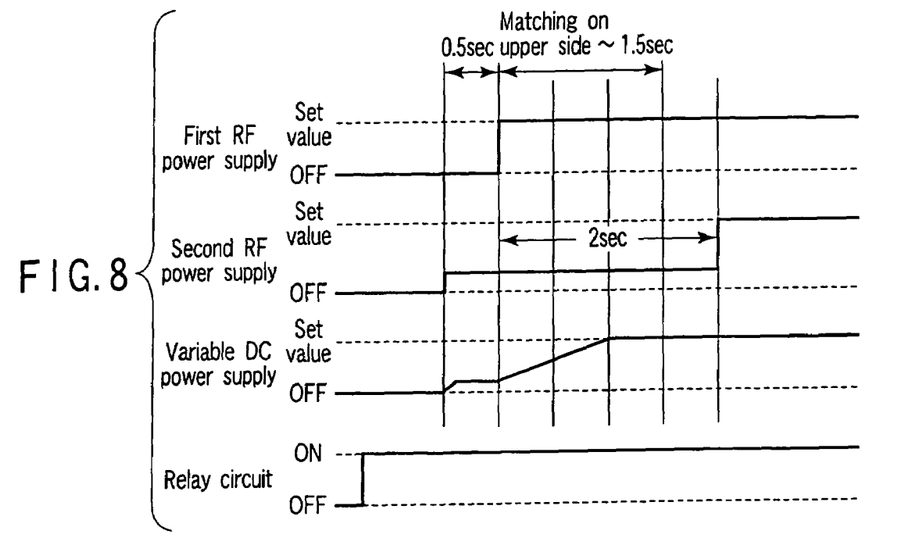
FIG. 8 is a view showing a further alternative preferable example of an application sequence, which involves the DC voltage of the variable DC power supply and the RF powers of the first and second RF power supplies, along with the ON/OFF of the relay circuit, used in the plasma etching apparatus shown in FIG. 1.

Next, with reference to FIG. 8, an explanation will be given of another example of gradual increase in the application voltage of the variable DC power supply 50. FIG. 8 is a view showing a further alternative preferable example of an application sequence, which involves the DC voltage of the variable DC power supply 50 and the RF powers of first and second RF power supplies 48 and 90, along with the ON/OFF of the relay circuit 52, used in the plasma etching apparatus shown in FIG. 1.

At first, the second RF power supply 90 starts applying an RF power lower than its set value to the susceptor 16. At the same time, the variable DC power supply 50 starts applying a DC voltage to the upper electrode 34 such that the application voltage is gradually increased to and then maintained at a value lower than its set value. Then, the first RF power supply 48 starts applying an RF power at its set value to the upper electrode 34. At the same time when the first RF power supply 48 starts applying the RF power, the variable DC power supply 50 starts shifting the DC voltage applied to the upper electrode 34 under control such that the application voltage is gradually increased to eventually reach its set value. Then, after the first RF power supply 48 starts applying the RF power, the second RF power supply 90 shifts the application power to its set value. The relay circuit 52 is operated in the same manner as in the example shown in FIG. 7. Also with this sequence, the feed circuit of the variable DC power supply 50 can be less forced while damage to the wafer W is suppressed.

Figure 9:
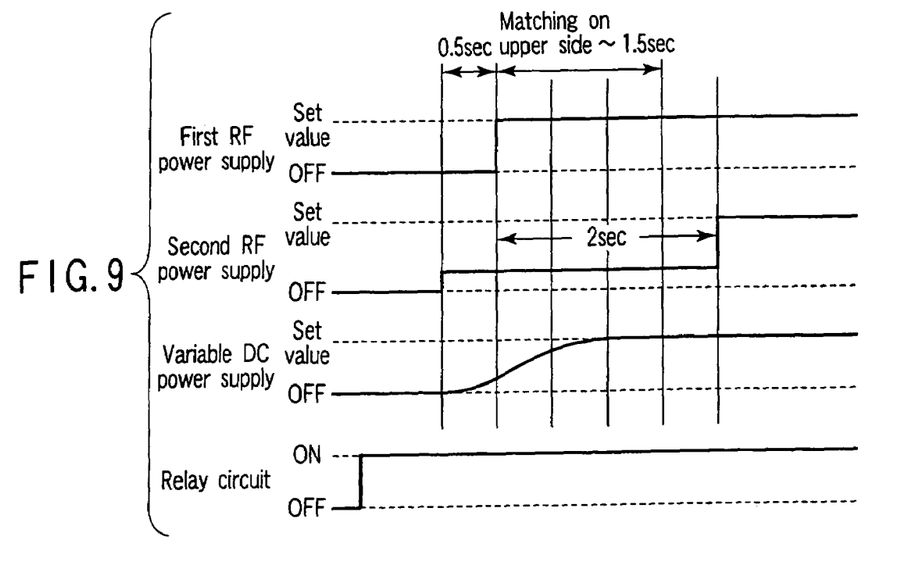
FIG. 9 is a view showing a further alternative preferable example of an application sequence, which involves the DC voltage of the variable DC power supply and the RF powers of the first and second RF power supplies, along with the ON/OFF of the relay circuit, used in the plasma etching apparatus shown in FIG. 1.

FIG. 9 is a view showing a further alternative preferable example of an application sequence, which involves the DC voltage of the variable DC power supply 50 and the RF powers of first and second RF power supplies 48 and 90, along with the ON/OFF of the relay circuit 52, used in the plasma etching apparatus shown in FIG. 1.

At first, the second RF power supply 90 starts applying an RF power lower than its set value to the susceptor 16. At the same time, the variable DC power supply 50 starts applying a DC voltage to the upper electrode 34 such that the application voltage is gradually increased to trace a since curve shown in FIG. 9. Then, the first RF power supply 48 starts applying an RF power at its set value to the upper electrode 34.

After the application voltage from the variable DC power supply 50 reaches its set value, the second RF power supply 90 shifts the application power to its set value. The relay circuit 52 is operated in the same manner as in the examples shown in FIGS. 7 and 8. Also with this sequence, the feed circuit of the variable DC power supply 50 can be less damaged while suppressing damage to the wafer W.

As described above, it is preferable to perform control such that the variable DC power supply 50 causes the DC voltage applied therefrom to reach its set value, when or after the first RF power supply 48 starts applying the RF power. Further, it is preferable to perform control such that the variable DC power supply 50 starts applying the DC voltage, when or after the first RF power supply 48 starts applying the RF power.

In some examples described above, the variable DC power supply 50 gradually increases the voltage applied therefrom. Similarly, when the plasma etching process is ending, the variable DC power supply 50 may be controlled to gradually decrease the voltage applied therefrom (i.e., gradual decrease control). In this case, the timing thereof is not limited to a specific one, but it is preferable to perform control such that the variable DC power supply 50 starts decreasing the voltage applied therefrom from its set value, when or after the first and second RF power supplies 48 and 90 stop applying the RF powers. Further, it is preferable to perform control such that the variable DC power supply 50 stop applying the voltage, when or after the first and second RF power supplies 48 and 90 stop applying the RF powers.

The DC voltage application timing according to this embodiment may be similarly applied to a process for sequentially etching a plurality of layers, such as a process for first etching an $SiO_2$ film and then etching an SiC or SiN film. However, such sequential etching processes include various processes, such as a process that requires plasma to be intermitted and a process that requires plasma to be continued. Accordingly, their application sequence is not limited to a specific one, and the sequence may be suitably designed in accordance with the corresponding process. Where a sequential etching process is performed, the relay circuit 52 is preferably maintained in the ON-state.

Next, an explanation will be given of functions and effects obtained where a DC voltage is applied from the variable DC power supply 50 to the upper electrode 34.

The application electrode or upper electrode 34 is preferably set to have a self bias voltage $V_{dc}$ on the surface, at a level for obtaining a predetermined (moderate) sputtering effect onto the surface, i.e., the surface of the electrode plate 36. In order to achieve this, the application voltage from the variable DC power supply 50 is preferably controlled to increase the absolute value of $V_{dc}$ on the surface of the upper electrode 34. Where the RF power applied from the first RF power supply 48 is low, polymers are deposited on the upper electrode 34. However, since a suitable DC voltage is applied from the variable DC power supply 50, polymers deposited on the upper electrode 34 are sputtered, thereby cleaning up the surface of the upper electrode 34. Further, an optimum quantity of polymers can be supplied onto the semiconductor wafer W, thereby canceling the surface roughness of a photo-resist film. Where the voltage applied from the variable DC power supply 50 is adjusted to sputter the body of the upper electrode 34, the electrode material can be supplied onto the surface of the semiconductor wafer W. In this case, the photo-resist film is provided with carbide formed on the surface, and is thereby reinforced. Further, the sputtered electrode material reacts with F contained in a fluorocarbon family process gas and is exhausted, thereby reducing the F ratio in plasma for the photo-resist film to be less etched.

Particularly, where the electrode plate 36 is made of a silicon-containing material, such as silicon or SiC, sputtered silicon from the surface of the electrode plate 36 reacts with polymers, so the photo-resist film is provided with SiC formed on the surface, and is thereby remarkably reinforced. In addition to this, Si is highly reactive with F, and the effects described above are enhanced. Accordingly, a silicon-containing material is preferably used as a material of the electrode plate 36.

Figure 10:
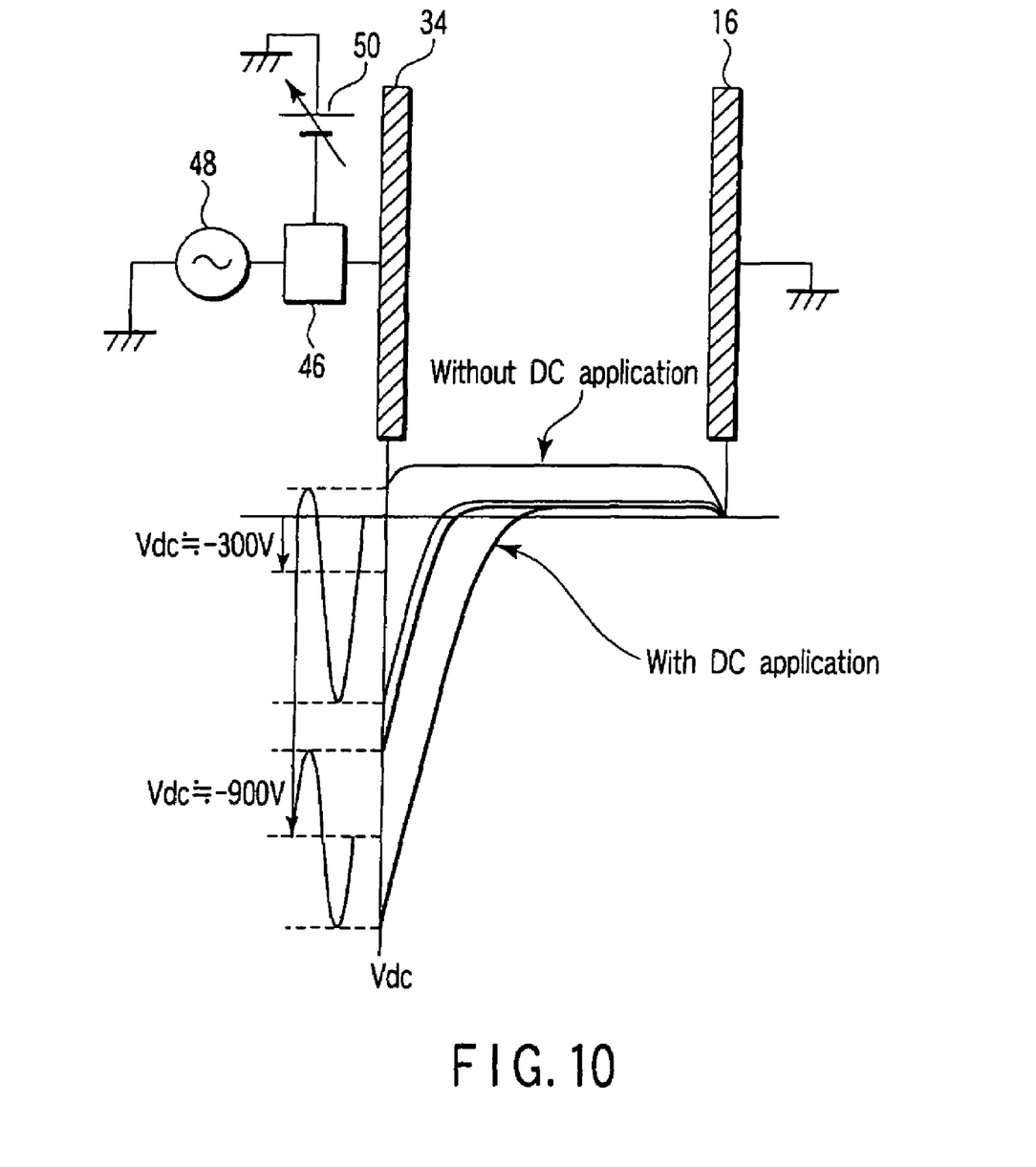
FIG. 10 is a view showing change in $V_{dc}$ (a DC voltage generated in the upper electrode) and plasma sheath thickness where a DC voltage is applied to the upper electrode in the plasma etching apparatus shown in FIG. 1.
Figure 11A:
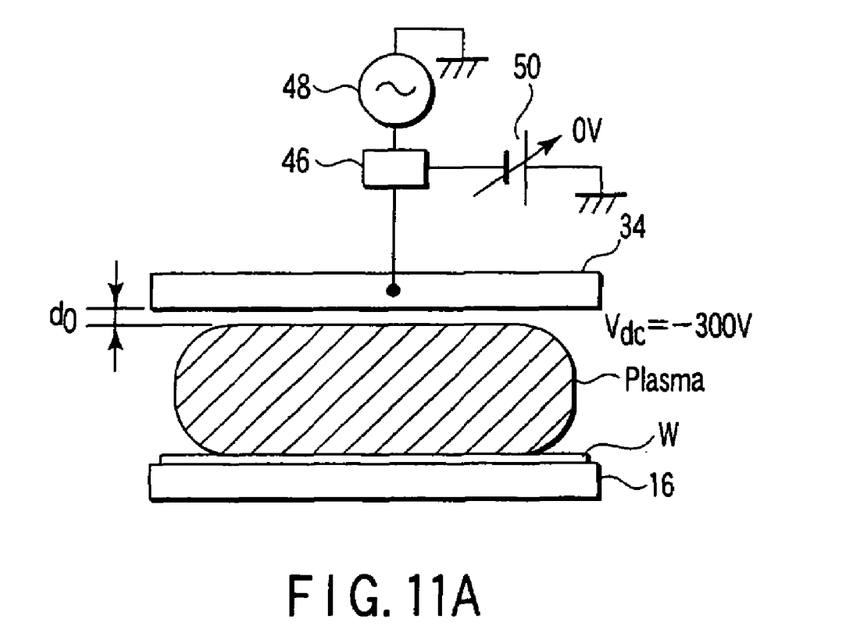
FIGS. 11A and 11B are views showing plasma states in comparison where a DC voltage is applied and where no DC voltage is applied, in the plasma etching apparatus shown in FIG. 1.
Figure 11B:
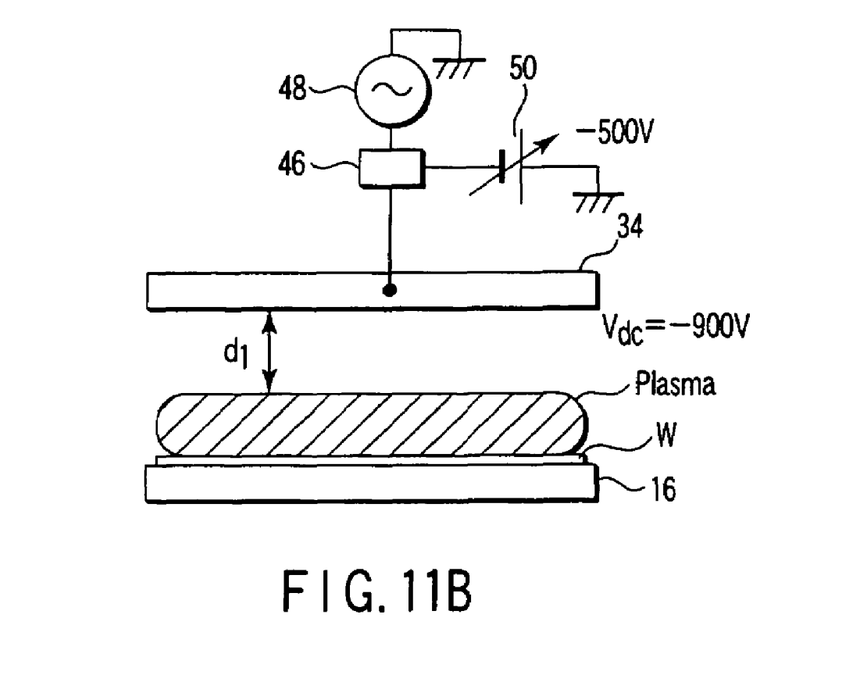

FIG. 10 is a view showing change in $V_{dc}$ and plasma sheath thickness where a DC voltage is applied to the upper electrode in the plasma etching apparatus shown in FIG. 1. FIGS. 11A and 11B are views showing plasma states in comparison where a DC voltage is applied and where no DC voltage is applied, in the plasma etching apparatus shown in FIG. 1.

The DC voltage thus applied to the upper electrode 34 to make a deep self bias voltage $V_{dc}$, as described above, increases the thickness of a plasma sheath formed on the upper electrode 34, as shown in FIG. 10. As the thickness of the plasma sheath is increased, the plasma is more compressed by that much. For example, where no DC voltage is applied to the upper electrode 34, $V_{dc}$ on the upper electrode side becomes, e.g., −300V. In this case, the plasma sheath has a small thickness $d_0$, as shown in FIG. 11A. On the other hand, where a DC voltage of −900V is applied to the upper electrode 34, $V_{dc}$ on the upper electrode side becomes −900V. In this case, since the thickness of the plasma sheath is in proportion to ¾ of the absolute value of $V_{dc}$, the plasma sheath has a larger thickness $d_1$, and the plasma is compressed by that much, as shown in FIG. 11B.

Where the thickness of the plasma sheath is thus increased to suitably compress the plasma, the effective residence time above the semiconductor wafer W is decreased. Further, the plasma concentrates above the wafer W with less diffusion, thereby reducing the dissociation space. In this case, dissociation of a fluorocarbon family process gas is suppressed for the photo-resist film to be less etched. Accordingly, the application voltage from the variable DC power supply 50 is preferably controlled by the controller 51, such that the thickness of the plasma sheath on the upper electrode 34 is increased to a level for forming desired compressed plasma.

Further, when the plasma is formed, electrons are generated near the upper electrode 34. When a DC voltage is applied from the variable DC power supply 50 to the upper electrode 34, this voltage serves to accelerate electrons in the vertical direction within the process space (Vpp also serves to accelerate electrons). In other words, the variable DC power supply 50 can be set at a desired polarity, voltage value, and current value, to radiate electrons onto the semiconductor wafer W. The radiated electrons reform the composition of the mask or photo-resist film to reinforce the film.

As described above, the DC voltage applied to the upper electrode 34 can be controlled, so as to exercise the sputtering function onto the upper electrode 34 and the plasma compressing function, as well as the supply function of supplying a large quantity of electrons generated at the upper electrode 34 to the semiconductor wafer W, as described above. This arrangement makes it possible to reinforce the photo-resist film, supply optimum polymers, and suppress dissociation of the process gas. As a consequence, the surface roughness of the photo-resist is suppressed, and the etching selectivity of an etching target layer relative to the photo-resist film is increased. Further, the CD of an opening portion formed in the photo-resist film is prevented from expanding, thereby realizing pattern formation with high accuracy. Particularly, these effects are more enhanced by controlling the DC voltage to suitably exercise the three functions described above, i.e., the sputtering function, plasma compressing function, and electron supply function.

It should be noted that, it depends on process conditions or the like to determine which one of the functions described above is predominant. The voltage applied from the variable DC power supply 50 is preferably controlled by the controller 51 to exercise one or more of the functions to effectively obtain the corresponding effects.

The DC voltage applied to the upper electrode 34 can be adjusted to control the plasma potential. Where the plasma potential is decreased by the DC voltage, etching by-products can be prevented from being deposited on the upper electrode 34, the deposition shield 11 forming a part of the chamber wall, the inner wall member 26, and the insulating shield member 42.

If etching by-products are deposited on the upper electrode 34 or the deposition shield 11 forming the chamber wall, a problem may arise in that the process characteristics change or particles are generated. Particularly, where sequentially etching is performed on a multi-layered film, since suitable etching conditions are different for the respective films, a memory effect may occur in that a previous process leaves some effect that affects a subsequent process. The amount of deposition of etching by-products described above depends on the potential difference between the plasma and the upper electrode 34, chamber wall, or the like. Accordingly, deposition of etching products can be suppressed by controlling the plasma potential by DC voltage application.

Further, the DC voltage applied to the upper electrode 34 can be controlled to effectively exercise the plasma potential control-function, in addition to the sputtering function onto upper electrode 34, plasma compressing function, and electron supply function, as described above.

The present invention is not limited to the embodiment described above, and it may be modified in various manners. For example, the embodiment described above is exemplified by a plasma etching apparatus of the type that includes an upper electrode and a lower electrode disposed to face each other, wherein an RF power for plasma generation is applied to the upper electrode while an RF power for ion attraction is applied to the lower electrode. However, the present invention is not limited to a plasma etching apparatus of this type. FIGS. 12 to 15 are views each schematically showing a plasma etching apparatus of an alternative type according to another embodiment of the present invention.

Figure 12:
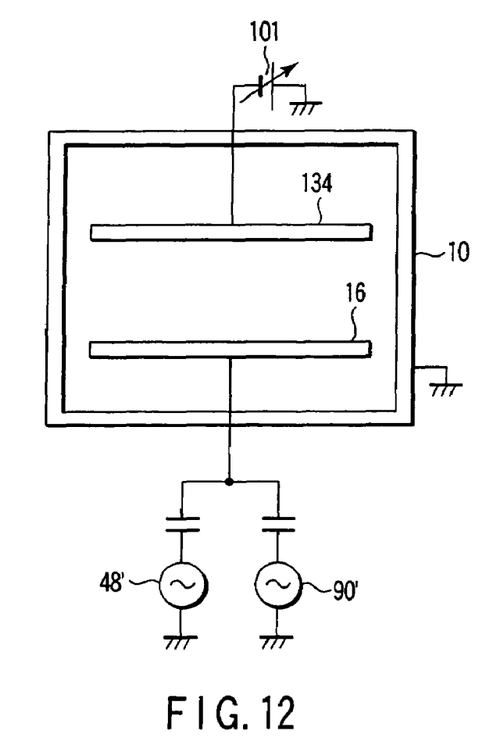
FIG. 12 is a view schematically showing a plasma etching apparatus of an alternative type according to another embodiment of the present invention.

FIG. 12 shows an apparatus of the type that applies two powers with different frequencies to the lower side. Specifically, a lower electrode or susceptor 16 is supplied with an RF power for plasma generation with a frequency of, e.g., 60 MHz from a first RF electrode 48', and also supplied with an RF power for ion attraction with a frequency of, e.g., 2 MHz from a second RF power supply 90'. In this case, the upper electrode 134 is further connected to a variable DC power supply 101 and supplied with a predetermined DC voltage therefrom, so as to obtain the same effects as those in the embodiment described above.

Figure 13:
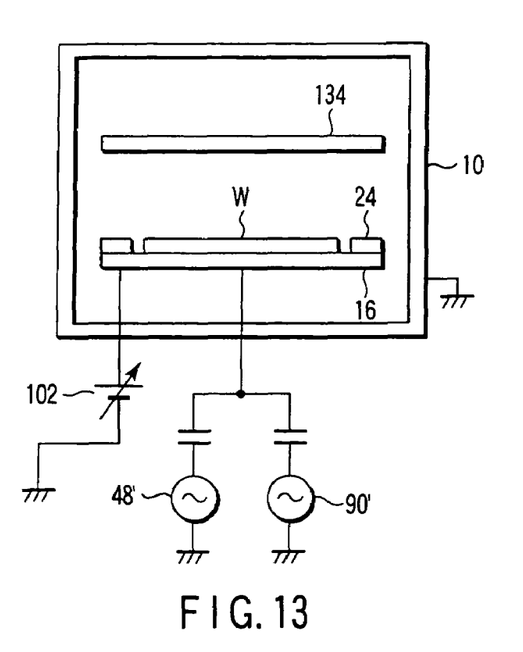
FIG. 13 is a view schematically showing a plasma etching apparatus of the alternative type according to another embodiment of the present invention.

FIG. 13 shows an apparatus of the same type as that of the apparatus shown in FIG. 12, i.e., which applies two powers with different frequencies to the lower side. In this type, the lower electrode or susceptor 16 may be connected to a variable DC power supply 101 and supplied with a predetermined DC voltage therefrom.

Figure 14:
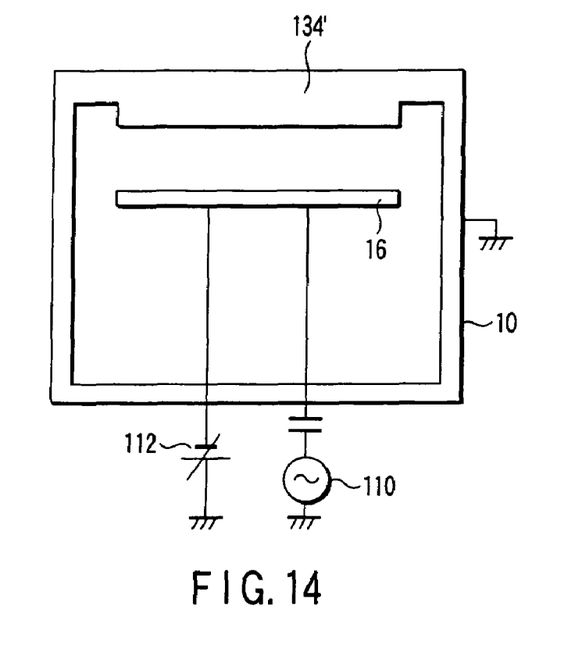
FIG. 14 is a view schematically showing a plasma etching apparatus of a further alternative type according to another embodiment of the present invention.

FIG. 14 shows an apparatus of the type that includes an upper electrode 134' grounded through a chamber 10 and a lower electrode or susceptor 16 connected to an RF power supply 110 from which an RF power for plasma generation with a frequency of, e.g., 13.56 MHz is applied. In this case, the lower electrode or susceptor 16 is further connected to a variable DC power supply 112 and supplied with a predetermined DC voltage therefrom, so as to obtain the same effects as those in the embodiment described above.

Figure 15:
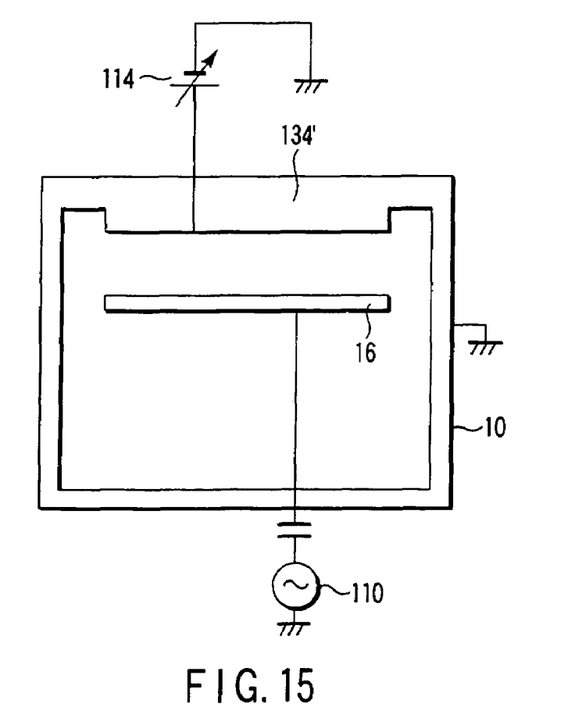
FIG. 15 is a view schematically showing a plasma etching apparatus of the further alternative type according to another embodiment of the present invention.

FIG. 15 shows an apparatus of the same type as that of the apparatus shown in FIG. 14. In this type, the upper electrode 134' may be connected to a variable DC power supply 114 and supplied with a predetermined DC voltage therefrom.

In the embodiment described above, the present invention is applied to plasma etching, for example. Alternatively, the present invention may be applied to another plasma process, such as sputtering or plasma CVD. Further, the target substrate is not limited to a semiconductor wafer, and it may be another substrate, such as a glass substrate used for an LCD.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A plasma etching apparatus comprising:
   a process container configured to accommodate a target substrate and to be vacuum-exhausted;

a first electrode and a second electrode disposed opposite each other within the process container, the first electrode being an upper electrode and the second electrode being a lower electrode configured to place the target substrate thereon;

a process gas supply unit configured to supply a process gas into the process container;

an RF power supply configured to apply an RF power to the first electrode or second electrode to generate plasma of the process gas;

a DC power supply configured to apply a DC voltage to the first electrode; and a control section configured to control the RF power supply and the DC power supply, wherein the control section is preset to perform control such that the DC power supply causes the DC voltage applied therefrom to reach a voltage set value, when or after the RF power supply starts applying the RF power, to perform a predetermined plasma etching process on the target substrate, and the DC power supply starts decreasing the DC voltage applied therefrom from the voltage set value, when or before the RF power supply stops applying the RF power, to end the predetermined plasma etching process.

2. The plasma etching apparatus according to claim 1, wherein the control section is preset to perform control such that the DC power supply starts applying the DC voltage, when or after the RF power supply starts applying the RF power.

3. The plasma etching apparatus according to claim 1, wherein the control section is preset to perform control such that the DC power supply gradually decreases a voltage, current, or power applied therefrom.

4. The plasma etching apparatus according to claim 1, wherein the control section is preset to perform control such that the DC power supply stops applying the DC voltage, when or before the RF power supply stops applying the RF power.

5. The plasma etching apparatus according to claim 1, wherein the RF power supply is configured to apply the RF power to the first electrode.

6. The plasma etching apparatus according to claim 1, wherein the control section is preset to perform control such that the DC power supply gradually increases a voltage, current, or power applied therefrom.

7. The plasma etching apparatus according to claim 6, wherein the control section is preset to perform control such that the DC power supply gradually increases the voltage, current, or power applied therefrom, and the DC power supply holds the DC voltage when the voltage, current, or power applied therefrom exceeds a predetermined value.

8. A plasma etching apparatus comprising:
a process container configured to accommodate a target substrate and to be vacuum-exhausted;
a first electrode disposed within the process container and configured to serve as an upper electrode;
a second electrode disposed opposite the first electrode within the process container and configured to serve as a lower electrode to place the target substrate thereon;
a process gas supply unit configured to supply a process gas into the process container;
a first RF power supply configured to apply a first RF power to the first electrode to generate plasma of the process gas;
a second RF power supply configured to apply a second RF power to the second electrode to attract ions toward the target substrate;
a DC power supply configured to apply a DC voltage to the first electrode; and
a control section configured to control the first and second RF power supplies and the DC power supply, wherein the control section is preset to perform control such that the DC power supply causes the DC voltage applied therefrom to reach a voltage set value, when or after the first RF power supply starts applying the first RF power, to perform a predetermined plasma etching process on the target substrate, and the DC power supply starts decreasing the DC voltage applied therefrom from the voltage set value, when or before at least one of the first and second RF power supplies stops applying the RF power, to end the predetermined plasma etching process.

9. The plasma etching apparatus according to claim 8, wherein the control section is preset to perform control such that the DC power supply starts applying the DC voltage, when or after the first RF power supply starts applying the first RF power.

10. The plasma etching apparatus according to claim 8, wherein the control section is preset to perform control such that the second RF power supply first starts applying the second RF power at a power value lower than a second power set value, then the first RF power supply starts applying the first RF power, then the DC power supply causes the DC voltage applied therefrom to reach the voltage set value, and then the second RF power supply causes the second RF power applied therefrom to reach the second power set value.

11. The plasma etching apparatus according to claim 8, wherein the control section is preset to perform control such that the DC power supply gradually decreases a voltage, current, or power applied therefrom.

12. The plasma etching apparatus according to claim 8, wherein the control section is preset to perform control such that the DC power supply stops applying the DC voltage, when or before at least one of the first and second RF power supplies stops applying the RF power.

13. The plasma etching apparatus according to claim 8, wherein the control section is preset to perform control such that the DC power supply gradually increases a voltage, current, or power applied therefrom.

14. The plasma etching apparatus according to claim 13, wherein the control section is preset to perform control such that the DC power supply gradually increases the voltage, current, or power applied therefrom, and the DC power supply holds the DC voltage when the voltage, current, or power applied therefrom exceeds a predetermined value.

15. A plasma etching method for performing plasma etching on a target substrate in a plasma etching apparatus,
the plasma etching apparatus comprising
a process container configured to accommodate a target substrate and to be vacuum-exhausted,
a first electrode and a second electrode disposed opposite each other within the process container, the first electrode being an upper electrode and the second electrode being a lower electrode configured to place the target substrate thereon,
a process gas supply unit configured to supply a process gas into the process container,
an RF power supply configured to apply an RF power to the first electrode or second electrode to generate plasma of the process gas, and
a DC power supply configured to apply a DC voltage to the first electrode, and the plasma etching method comprising:

performing control such that the DC power supply causes the DC voltage applied therefrom to reach a voltage set value, when or after the RF power supply starts applying the RF power, to perform a predetermined plasma etching process on the target substrate, and the DC power supply starts decreasing the DC voltage applied therefrom from the voltage set value, when or before the RF power supply stops applying the RF power, to end the predetermined plasma etching process.

16. The plasma etching method according to claim 15, comprising performing control such that the DC power supply starts applying the DC voltage, when or after the RF power supply starts applying the RF power.

17. The plasma etching method according to claim 15, comprising performing control such that the DC power supply gradually decreases a voltage, current, or power applied therefrom.

18. The plasma etching method according to claim 15, comprising performing control such that the DC power supply stops applying the DC voltage, when or before the RF power supply stops applying the RF power.

19. The plasma etching method according to claim 15, comprising performing control such that the DC power supply gradually increases a voltage, current, or power applied therefrom.

20. The plasma etching method according to claim 19, comprising performing control such that the DC power supply gradually increases the voltage, current, or power applied therefrom, and the DC power supply holds the DC voltage when the voltage, current, or power applied therefrom exceeds a predetermined value.

21. A plasma etching method for performing plasma etching on a target substrate in a plasma etching apparatus, the plasma etching apparatus comprising a process container configured to accommodate a target substrate and to be vacuum-exhausted, a first electrode disposed within the process container and configured to serve as an upper electrode, a second electrode disposed opposite the first electrode within the process container and configured to serve as a lower electrode to place the target substrate thereon, a process gas supply unit configured to supply a process gas into the process container, a first RF power supply configured to apply a first RF power to the first electrode to generate plasma of the process gas, a second RF power supply configured to apply a second RF power to the second electrode to attract ions toward the target substrate, and a DC power supply configured to apply a DC voltage to the first electrode, the plasma etching method comprising:

performing control such that the DC power supply causes the DC voltage applied therefrom to reach a voltage set value, when or after the first RF power supply starts applying the first RF power, to perform a predetermined plasma etching process on the target substrate, and the DC power supply starts decreasing the DC voltage applied therefrom from the voltage set value, when or before at least one of the first and second RF power supplies stops applying an RF power, to end the predetermined plasma etching process.

22. The plasma etching method according to claim 21, comprising performing control such that the DC power supply starts applying the DC voltage, when or after the first RF power supply starts applying the first RF power.

23. The plasma etching method according to claim 21, comprising performing control such that the second RF power supply first starts applying the second RF power at a power value lower than a second power set value, then the first RF power supply starts applying the first RF power, then the DC power supply causes the DC voltage applied therefrom to reach the voltage set value, and then the second RF power supply causes the second RF power applied therefrom to reach the second power set value.

24. The plasma etching method according to claim 21, comprising performing control such that the DC power supply gradually decreases a voltage, current, or power applied therefrom.

25. The plasma etching method according to claim 21, comprising performing control such that the DC power supply stops applying the DC voltage, when or before at least one of the first and second RF power supplies stops applying the RF power.

26. The plasma etching method according to claim 21, comprising performing control such that the DC power supply gradually increases a voltage, current, or power applied therefrom.

27. The plasma etching method according to claim 26, comprising performing control such that the DC power supply gradually increases the voltage, current, or power applied therefrom, and the DC power supply holds the DC voltage when the voltage, current, or power applied therefrom exceeds a predetermined value.

* * * * *